(12) United States Patent
Ayotte et al.

(10) Patent No.: US 8,987,010 B1
(45) Date of Patent: Mar. 24, 2015

(54) MICROPROCESSOR IMAGE CORRECTION AND METHOD FOR THE DETECTION OF POTENTIAL DEFECTS

(71) Applicant: International Business Machines Corporation, Armonk, NY (US)

(72) Inventors: Stephen P. Ayotte, Essex Junction, VT (US); Nicholas G. Clore, Essex Junction, VT (US); Andrew H. Norfleet, Burlington, VT (US); Jared P. Yanofsky, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 14/013,067

(22) Filed: Aug. 29, 2013

(51) Int. Cl.
*H01L 21/00* (2006.01)
*H01L 21/66* (2006.01)

(52) U.S. Cl.
CPC ..................................... *H01L 22/12* (2013.01)
USPC ................................. 438/16; 438/14; 438/17

(58) Field of Classification Search
None
See application file for complete search history.

(56) References Cited

U.S. PATENT DOCUMENTS

| | | | | |
|---|---|---|---|---|
| H1530 H | * | 5/1996 | Lee | 345/424 |
| 5,537,669 A | * | 7/1996 | Evans et al. | 382/141 |
| 5,923,430 A | * | 7/1999 | Worster et al. | 356/394 |
| 6,650,130 B1 | | 11/2003 | Kash et al. | |
| 7,154,605 B2 | * | 12/2006 | Worster et al. | 356/435 |
| 8,669,523 B2 | * | 3/2014 | Chen et al. | 250/306 |
| 2002/0150286 A1 | | 10/2002 | Onishi | |
| 2004/0010444 A1 | | 1/2004 | Delorme et al. | |
| 2004/0047501 A1 | | 3/2004 | Kuwabara | |
| 2010/0208978 A1 | | 8/2010 | Terasawa | |
| 2011/0309842 A1 | | 12/2011 | Behzad et al. | |
| 2012/0076396 A1 | | 3/2012 | Sakai | |
| 2012/0128230 A1 | | 5/2012 | Maeda | |
| 2012/0288183 A1 | | 11/2012 | Park | |

OTHER PUBLICATIONS

Chong, S. et al., "Accelerated 65nm Yield Ramp through Optimization of Inspection on Process-Design Sensitive Test Chips", Advanced Semiconductor Manufacturing Conference, IEEE, Jun. 11-12, 2007, 5 pages.
Shankar N.G. et al., "Classification of Defects on Semiconductor Wafers using Priority Rules", Trans Tech Publications, Defects and Diffusion Forum, vol. 230-232, 2004, pp. 135-148.
Le, Q. et al., "Building High-Level Features Using Large Scale Unsupervised Learning", Proceedings of the 29th International Conference on Machine Learning, 2012, 11 pages.

* cited by examiner

*Primary Examiner* — Charles Garber
*Assistant Examiner* — Evren Seven
(74) *Attorney, Agent, or Firm* — Michael Le Strange; Roberts Mlotkowski Safran & Cole, P.C.

(57) ABSTRACT

Systems and methods are provided for developing usable chip images in order to detect and screen defects or anomalies in a manufacturing environment. More specifically, a method is provided for manufacturing at least one wafer or chip. The method includes obtaining image data of the at least one wafer or chip. The method further includes correcting the image data to remove normal variation within the image data. The method further includes comparing the corrected image data to image data for at least one other wafer or chip to determine whether the corrected image data for the at least one wafer or chip shows a defect or anomaly beyond that of the normal variation. The method further includes placing the at least one wafer or chip into a category of fabrication based on the comparison.

16 Claims, 7 Drawing Sheets

MICROPROCESSOR IMAGE CORRECTION AND METHOD FOR THE DETECTION OF POTENTIAL DEFECTS

FIELD OF THE INVENTION

The invention relates to semiconductor device fabrication, and more particularly, to systems and methods for developing usable chip images in order to detect and screen defects or anomalies in a manufacturing environment.

BACKGROUND

Semiconductor device fabrication operations are commonly used to manufacture components onto a semiconductor substrate to form a semiconductor wafer. The semiconductor device fabrication operations use predetermined sequences of photolithographic and/or chemical processing steps to form components onto the semiconductor substrate. However, imperfections of the semiconductor substrate, imperfections of the semiconductor device fabrication operation, and/or imperfections in design of the components themselves due to process variations in the sequences of photolithographic and/or chemical processing steps, may cause one or more of the semiconductor components to be formed differently than expected.

Conventional automatic test equipment (ATE) is commonly used to verify that the semiconductor components within the semiconductor wafer are formed and operate as expected. The conventional automatic test equipment includes a full complement of electronic testing probes to carry out a testing operation. This full complement of electronic testing probes includes electronic testing probes to apply power, digital testing signals, and/or analog testing signals to each of the semiconductor components to perform the testing operation. This full complement of electronic testing probes also includes electronic probes to read signals at various nodes of the semiconductor components to verify that each of the semiconductor components operates as expected during the testing operation. However, some microprocessor defects and variations do not cause testable electrical failures, although these defects may cause anomalies that lead to electrical failures or unexpected performance degradation in the chip's field operation.

Chip imaging may provide an additional level of information about these defects and anomalies. Chip imaging typically includes using various imaging techniques to take a picture of the electrical activity on the chip. For example, the imaging techniques may include detecting heat signatures (e.g., thermal imaging), photon signatures (e.g., photon imaging), and/or magnetic signatures (e.g., magnetic imaging) of actual electrical activity on the chip. However, the use of chip imaging to achieve the additional level of information about these defects and anomalies produces high variability images where discerning the defects or anomalies from normal behavior or variation is nearly impossible.

Therefore, the current methods for identification of potential future fails of chips remains limited to statistical screening based on chip parametric data and traditional burn-in testing without the use of chip imaging. Accordingly, there exists a need in the art to overcome the deficiencies and limitations described hereinabove.

SUMMARY

In a first aspect of the invention, a method is provided for manufacturing at least one wafer or chip. The method includes obtaining image data of the at least one wafer or chip. The method further includes correcting the image data to remove normal variation within the image data. The method further includes comparing the corrected image data to image data for at least one other wafer or chip to determine whether the corrected image data for the at least one wafer or chip shows a defect or anomaly beyond that of the normal variation. The method further includes placing the at least one wafer or chip into a category of fabrication based on the comparison In a second aspect of the invention, a computer program product is provided comprising a computer readable storage medium having readable program code embodied in the storage medium. The computer program product includes at least one component operable to obtain thermal, photon, or magnetic image data of at least one wafer or chip during a fabrication process. The at least one component is further operable to correct the image data to remove normal variation caused by the fabrication process within the image data. The at least one component is further operable to compare the corrected image data to at least one standardized image to determine whether the corrected image data for the at least one wafer or chip shows a defect or anomaly beyond that of the normal variation. The at least one component is further operable to place the at least one wafer or chip into a category of fabrication based on the comparison.

In a third aspect of the invention, a method of manufacturing a chip stack is provided. The method includes obtaining image data of an incoming chip and image data of the chip stack. The method further includes analyzing the characteristics of the incoming chip and the chip stack in view of the respective image data to determine a match between the incoming chip and the chip stack to avoid chip stack failure. The method further includes that when the match is determined to avoid the chip stack failure, joining the incoming chip with the chip stack.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor device fabrication, and more particularly, to systems and methods for developing usable chip images in order to detect and screen defects or anomalies in a manufacturing environment. More specifically, the present invention provides systems and methods of manufacturing wafers or chips that leverage the use of existing imaging (e.g., thermal, magnetic, photon, etc.) techniques implemented in a manufacturing test program to create a map of electrical activity that can be overlaid on the physical layout of a chip. In embodiments, a method is provided for accounting for the variability of these images and the use thereof to improve the overall chip reliability and performance. Advantageously, embodiments of the present invention provide for a mechanism to overcome the inherent variability of chip imaging, and provide for an effective and efficient means for detecting defects or anomalies in chips that may cause a failure of the chip at a later time.

In order to overcome inherent variability of these images that is the result of normal processes and unavoidable fabrication variability, the resulting images may be corrected with historical data. For example, in embodiments, the wafer or chip images may be modified using historical processing data including an aggregate of microprocessor parametric, fabrication process, and/or kerf test data to identify and remove certain regional variations on the wafer or chip images. Thereafter, the corrected images may be compared to at least one standardized image to determine the presence of any defects or anomalies that could potentially lead to a failure of the chip. With this information, the chips may be used in a multitude of ways, as described herein.

As will also be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 1:
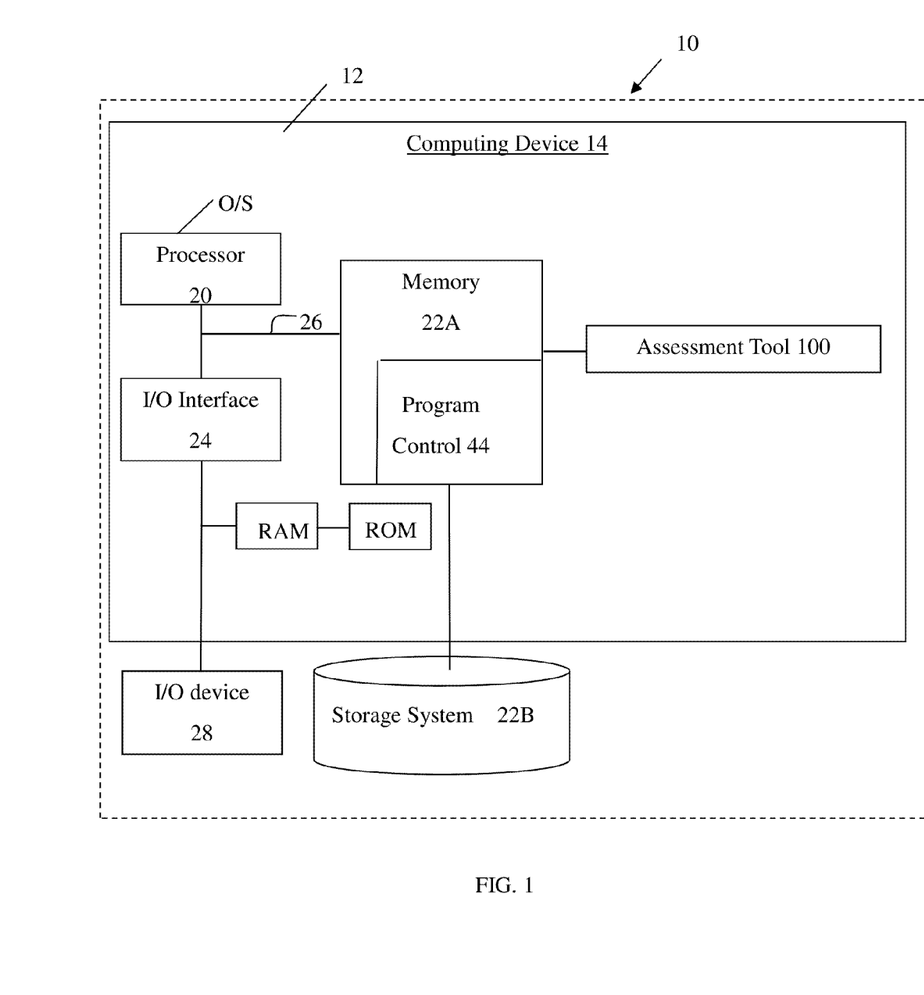
FIG. 1 is an illustrative external environment for implementing the processes and systems in accordance with aspects of the invention.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls an assessment tool 100 to perform the processes described herein. The assessment tool 100 can be implemented as one or more program code in the program control 44 stored in memory 22A as separate or combined modules. Additionally, the assessment tool 100 (e.g., an electronic design automation (EDA) tool) may be implemented as separate dedicated processors or a single or several processors to provide the function of this tool. While executing the computer program code, the processor 20 can read and/or write data to/from memory 22A, storage system 22B, and/or I/O interface 24. The program code executes the processes of the invention. The bus 26 provides a communications link between each of the components in the computing device 14.

In embodiments, the assessment tool 100 may be configured to obtain image data of at least one wafer or chip, and thereafter, determine whether the at least one wafer or chip has a defect or anomaly that could potential lead to a failure of a system implementing the chip. For example, in accordance with aspects of the present invention, the assessment tool 100 may be configured to obtain image data of the at least one wafer or chip, correct the image data to remove normal variation within the image data, compare the corrected image data to image data for at least one other wafer or chip to determine whether the corrected image data for the at least one wafer or chip shows a defect or anomaly beyond that of the normal variation, and place the at least one wafer or chip into a category of fabrication based on the comparison.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

FIGS. 2-6 show exemplary flows for performing aspects of the present invention. The steps of FIGS. 2-6 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Wafer Testing

Aspects of the present invention pertain to IC design and fabrication. As should be understood by those of skill in the art, the process for the design and fabrication of an IC may start with the design of a product idea (e.g., a chip design), which may be realized using EDA software such as that described herein with respect to FIG. 1 and FIG. 7. When the design is finalized, it can be taped-out. After tape-out, the chip fabrication process is consummated and manufacturing test programs may be implemented in order to determine whether the chip is functioning as designed, and to provide quality control and quality assurance during the commercial production of the chip.

Figure 2:
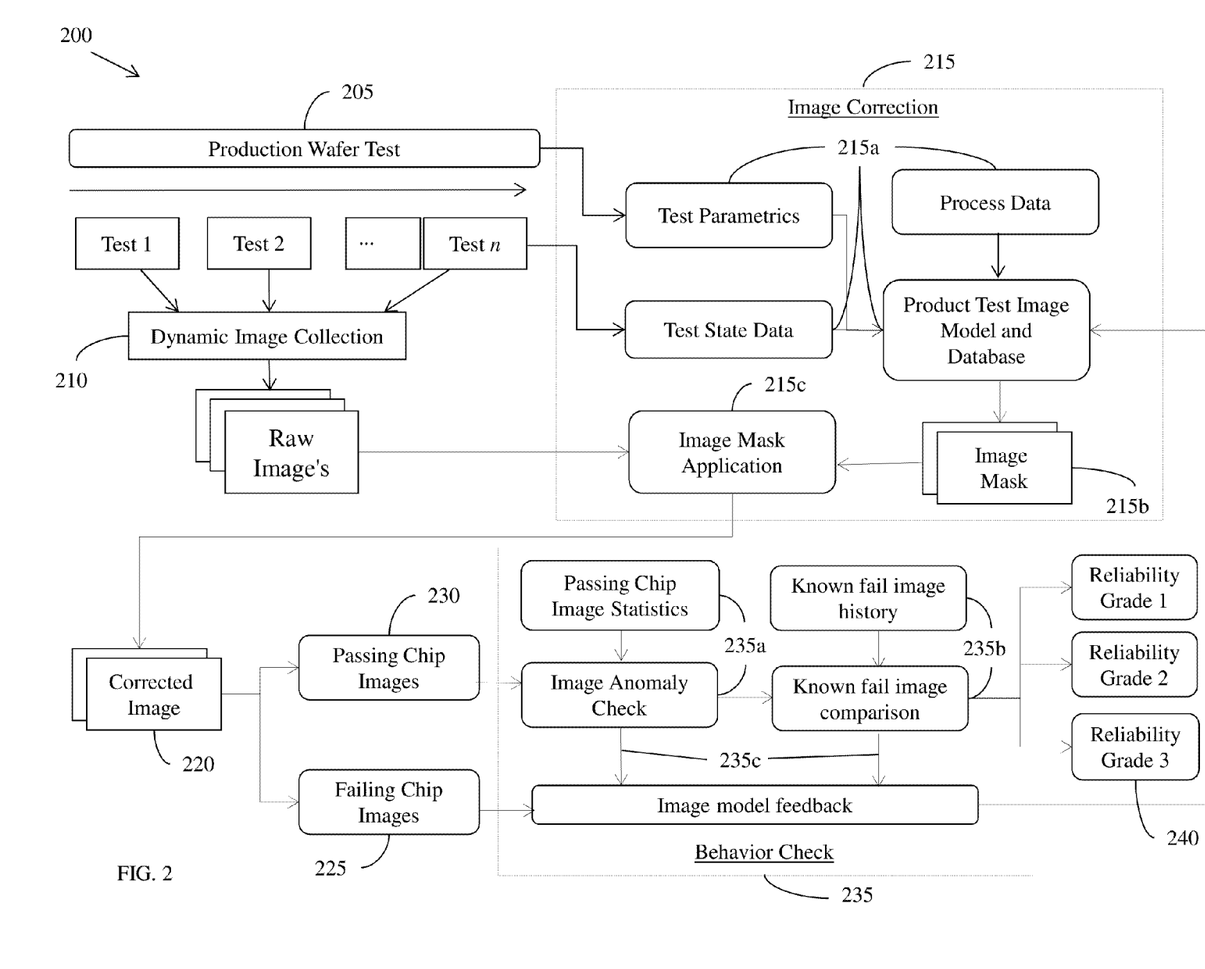
FIGS. 2-6 are illustrative process flows for implementing the system in accordance with aspects of the invention.
Figure 3:
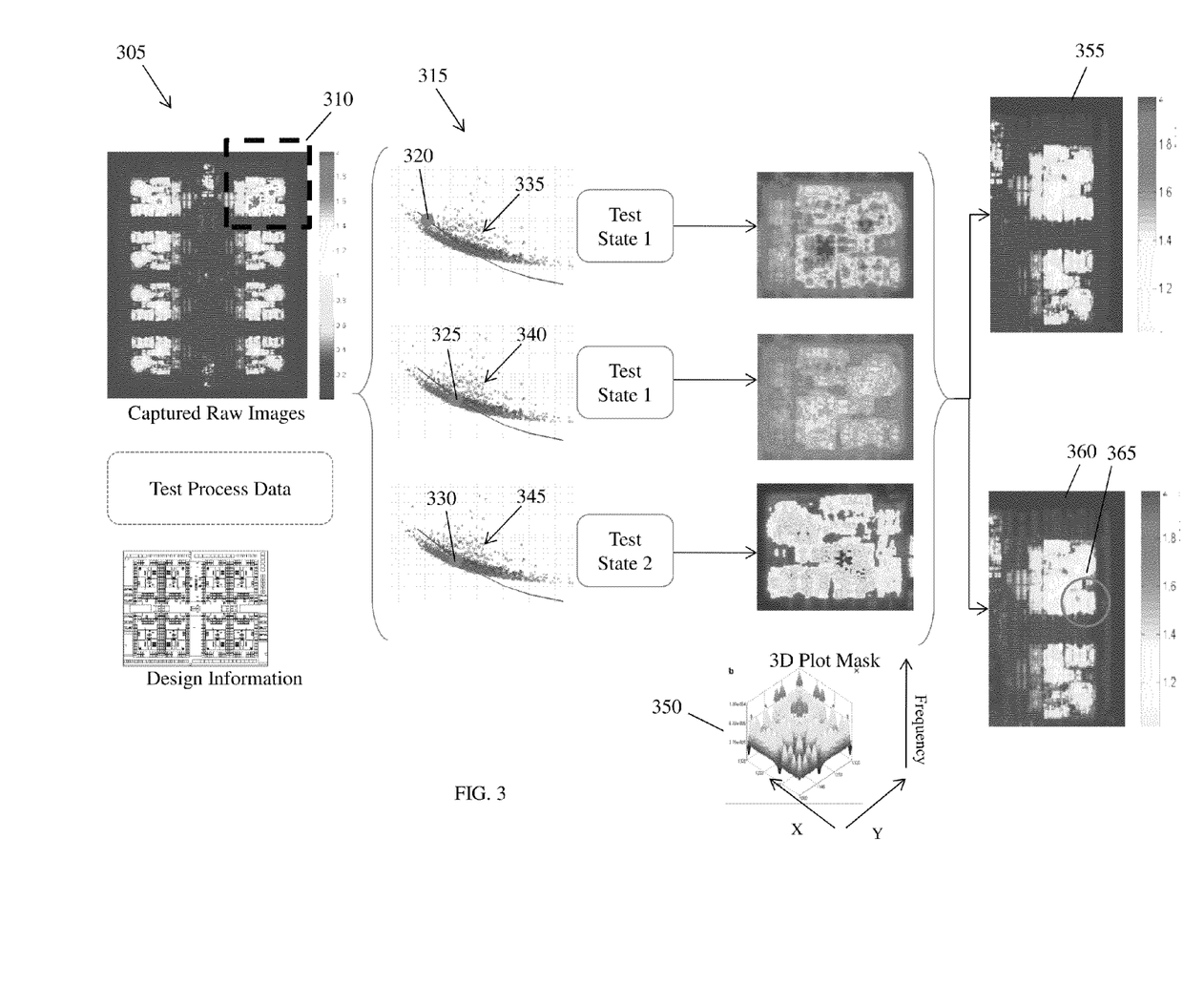

More specifically, FIG. 2 shows a wafer testing process 200 in accordance with aspect of the present invention. FIG. 3 will be described in conjunction with processes of the wafer testing process 200 of FIG. 2 in order to better describe the processes and resultant wafer and semiconductor device structures.

As shown in FIG. 2, the wafer testing process 200 may comprise multiple stages that occur during and after the fabrication process and prior to the final chip assembly process being consummated, which are described below. However, it should be noted that this wafer testing description is for illustration purposes only, and is not meant to limit the present invention. For example, an actual wafer testing process may require a designer and/or manufacturer to perform the wafer testing process in a different sequence than the sequence described herein.

At step 205, production wafer testing may be performed. In embodiments, the production wafer testing may be a step performed during semiconductor device fabrication. For example, during this step a portion or all individual integrated circuits that are present on the wafer may be tested for functional defects by applying special test patterns to the integrated circuits. The wafer testing may be performed by test equipment such as a wafer prober. In embodiments, the production wafer testing may comprise any number of steps or tests being performed (e.g., Test 1-Test n). For example, the production wafer testing may comprise any number of electrical tests being performed using various testing patterns in a predetermined sequence, as should be understood by those of skill in the art. Additionally or alternatively, the production wafer testing may comprise turning on the chips on the wafer without actually running any test patterns on the wafer (e.g., Test 0).

In embodiments, during the production wafer testing, various data may be collected that is relevant to the performance and stability of integrated circuits on the wafer. For example, any number of test parametrics may be collected during the production wafer testing. In accordance with aspects of the invention, the test parametrics may be anything that is a continuous variable encountered during the production wafer testing (e.g., voltage readings, current readings, timing readings, speed readings, performance readings, temperature readings, etc.).

Additionally, during the performance of the any number of the tests (e.g., Test 1-Test n), test data may be generated such as test state data, which comprises performance data of the integrated circuit logic (e.g., performance of the 1s and 0s during application of a testing pattern). Further, test data may be captured such as testing pattern data comprising the testing patterns applied during each Test 1-n and the sequence in which the testing patterns were applied for each Test 1-n. For example, the test state data may be used to link image data to specific electrical states that were occurring on the wafer during a step or test of the production wafer testing (e.g., Image 1 may be captured from the wafer during Test 1 during performance of testing pattern A and linked thereto by the test state data such that the electrical state of the wafer captured in Image 1 is tied to a specific step or test and/or testing pattern of the production wafer testing).

At step 210, dynamic image collection of a portion or all individual integrated circuits that are present on the wafer may be performed during the production wafer testing. Typically various types of imaging techniques (e.g., thermal, magnetic, and photon) may be implemented in a manufacturing test program on a case by case basis to diagnosis and isolate a known electrical failure. However, in accordance with aspects of the present invention, the dynamic image collection using these various types of imaging techniques may be performed regardless of case or any known electrical failures. Instead, the dynamic image collection may be performed to provide a series of raw images (e.g., snap shots) of each or a portion of the number of tests being performed (e.g., Test 0, Test 1-Test n).

At step 215, the raw images (obtained in step 210) may then be corrected to account for variability within the images that is a result of normal and typically unavoidable fabrication variability. In embodiments, the image correction process may comprise: (step 215a) collecting the test parametric data (obtained in step 205), the test state data (obtained in step 205), process data, product test image models, and fabrication database data; (step 215b) generating an image mask using the various collected data from step (215a); and (step 215c) applying the image mask to the raw images to generate the corrected images.

The process data includes any type of data obtained during the manufacturing process of the wafer. For example, the EDA tools used to manufacture the wafer, the parameters used to set up the EDA tools, the recipes and/or design information input into the EDA tools for fabricating portions of the wafer and integrated circuits, and any known variation that the wafer may have been subjected to during the manufacturing process. The product test image models and fabrication database data include any type of data obtained from the previous fabrication of wafers, chips, and integrated circuits. For example, the fabrication database data may include statistics of all previous wafers, chips, and integrated circuits manufactured, and the types of variation and effects of that variation that were identified within those wafers, chips, and integrated circuits.

In embodiments, the generating the image mask may comprise: (i) comparing the test parametric data, the test state data, and the process data for the wafer or chips passed through the production wafer test (wafer or chips of interest) to the test parametric data, the test state data, and/or the process data for other wafers or chips previously manufactured and stored within the database; (ii) identifying the other wafers or chips that have similar test parametric data, test state data, and/or process data to that of the wafer or chips of interest, and retrieving their associated test image data or models; (iii) using the retrieved test image data or models for the similar wafers or chips to determine similar types of variation that the wafer or chips of interest could have been exposed to during the manufacturing process; and (iv) generating an image mask that is configured to separate the determined similar types of variation from potential defects or anomalies on the wafer or chips of interest.

In embodiments, the applying the image mask may include applying the image mask generated in (iv) to the raw images of the wafer or chips of interest such that the raw images are corrected or normalized in a manner in which the determined similar types of variation are stripped out of the raw images. For example, the corrected or normalized images comprise the potential defects and not the variation caused by the test parametrics and the test manufacturing processes of the wafer or chips of interest.

In accordance with aspects of the present invention, the generating and applying the image mask may include utilizing imaging techniques as shown in FIG. 3 such as applying a color correction or filtering to the determined similar types of variation caused by the test parametrics and the test manufacturing processes. The color correction or filtering result in the stripping of the determined similar types of variation from the raw images.

For example, as shown in FIG. 3, captured data 305 including raw image data, test process data, and design information for at least one chip 310 on a wafer is analyzed in accordance with the test parametric data, the test state data, and/or the process data for other wafers or chips previously manufactured and stored within the database. The design information may include the test state data with the 1s and 0s mapped to physical locations or latches within the chip design and/or ideal simulations of a thermal mapping.

The data plots 315 show that this analysis may comprise a simulation to identify where the at least one chip 310 falls along a data plot represented by reference numerals 320, 325, and 330 within a parametric range 335, 340, and 345 (e.g., range for at least one test parametric), respectively, with respect to other chips previously manufactured and stored within the database. Correction masks 350, 355, and 360 may then be generated using the other chips that are similar to the at least one chip 310 (e.g., other chips at or near where the at least one chip 310 falls 320, 325, and 330 within the parametric range 335, 340, and 345, respectively). In embodiments, the correction masks may also include a 3D plot mask 350 generated from a minimum volume of data for each classification or test state.

Once the correction masks are generated, corrected images may be generated for the at least one chip 310. The corrected images may include a first corrected image 355 and/or a second corrected image 360. As shown in FIG. 3, the first corrected image 355 may be identified in subsequent processes as an acceptable corrected chip image, which does not comprise any variation caused by the test parametrics and the test manufacturing processes of the at least one chip 310. The second corrected image 360 may be identified in subsequent processes as a marginally corrected chip image, which also does not comprise any variation caused by the test parametrics and the test manufacturing processes of the at least one chip 310. However, the second corrected image 360 does include an artifact 365 left over after applying the correction masks. The artifact 365 may be detected in a subsequent behavior check analysis and identified as a potential cause of a chip failure.

At step 220, the corrected or normalized images are collected and analyzed to separate passing chip images from failing chip images. In embodiments, the failing chip images are identified as those chips that had an electrical failure that was detected during any number of steps or tests performed (e.g., Test 1-Test n) for the production wafer test. The failing chip images are the images of the chips that typically get thrown out or recycled during conventional production wafer testing. The passing chip images are identified as those chips that did not have an electrical failure detected during any number of steps or tests being performed (e.g., Test 1-Test n) for the production wafer test. The passing chip images are the images of the chips that may potentially identify a defect or anomaly that could cause a chip failure at a later time.

At step 225, the failing chip images are fed back into the feedback loop for future use in generating image masks and determining the possibility of failure in chips. For example, the failing chip images and associated parametric data, test state data, and process data for the wafer may be stored in the database, and used in subsequent analysis of fabricated wafers for potential defects or anomalies that could cause a chip failure at a later time. At step 230, the passing chip images are fed into a wafer behavior check analysis to determine whether defects or anomalies that could potential cause a chip failure exist in the wafer beyond the typical electrical failures determined by the steps or tests of the production wafer test.

At step 235, a behavior check analysis is performed on the passing chip images identified in step 230. In embodiments, the behavior check analysis is configured to determine whether defects or anomalies that could potential cause a chip failure exist in the wafer. The behavior check analysis may comprise: (step 235*a*) performing a defect or anomaly check on the passing chip images using historical passing chip statistics; (step 235*b*) performing a known fail image comparison between the passing chip images and historical failure imaging; and (step 235*c*) feeding all of the data created from the anomaly check and the image comparisons back into the feedback loop for future use in generating image masks and determining the possibility of failure in chips.

For example, at step 235*a* the passing chip images are analyzed with respect to historical passing chip statistics that may comprise the images of previously identified passing chips stored in the database. In embodiments, the historical passing chip statistics may comprise any chip data stored in the database for previously fabricated wafers and chips without regard to test parametric or state data and process data. In other words, the passing chip images may be compared to any historical data (e.g., raw and/or corrected image data) of previously fabricated wafers or chips to determine whether there are any major differences between the passing chip images and the historical data. The comparison may include setting a differentiation threshold of a predetermined amount (e.g., 90% or three sigma) and if the passing chip images fall within at least the threshold amount, then the chip most likely does not include a defect or anomaly that could cause a chip failure at a later time. On the other hand, if the chip images fall outside the differentiation threshold amount, then the corresponding chips may be flagged to have a defect or anomaly that could cause a chip failure at a later time.

At step 235*b*, the passing chips may be analyzed with respect to known fail image history. In embodiments, the known fail image history may include images of chips that are known to have failed in the past. For example, the known fail image history may include images of chips that are known to have historically passed the bad behavior check, but for some reason (e.g., identified or not identified reasons) the chips failed once they were put into use (e.g., used by a consumer). In other words, the passing chip images may be compared to images of chips that are known to have failed to determine whether there are any similarities between the passing chip images and the images of the known failures. The comparison may include setting a similarity threshold of a predetermined amount (e.g., 90% or three sigma) and if the passing chip images fall within at least the threshold amount, then the chip most likely does include a defect or anomaly that could cause a chip failure at a later time. On the other hand, if the chip images fall outside the similarity threshold amount, then the corresponding chips most likely do not have a defect or anomaly that could cause a chip failure at a later time.

At step 235*c*, the data created from the anomaly check and the image comparisons are fed back into the feedback loop for future use in generating image masks and determining the possibility of failure in chips. For example, the identification of any drastic differences between the between the passing chip images and the historical data that may include defects or anomalies that could cause a chip failure and the images of the passing chips that have the identified or unidentified defects or anomalies that could cause a chip failure are fed back into the historical database.

At step 240, the passing chip images are sorted into different reliability grades based on the defect and anomaly check and the known fail image comparison performed in the behavior check analysis. For example, passing chip images that have not been identified to have a defect or anomaly and do not have a match with the known fail image history may be placed into a reliability grade of one, e.g., a determined reliability of 90% may be assigned to the chips corresponding to these passing chip images. The passing chip images that are identified to have a defect or anomaly may be placed into a reliability grade of two, e.g., a determined reliability of 10% may be assigned to the chips corresponding to these passing chip images. The passing chip images that are identified to have a defect or anomaly and/or match with the known fail image history may be placed into a reliability grade of three, e.g., a determined reliability of 3% may be assigned to the chips corresponding to these passing chip images. In embodiments, the reliability grades may correspond to target reliability grades requested by the customer.

Accordingly, embodiments of the present invention provide for a means to overcome the inherent variability of chip imaging, and provide for an effective and efficient means for detecting defects or anomalies in chips that may cause a failure of the chip.

Chip Burn-In

Figure 4:
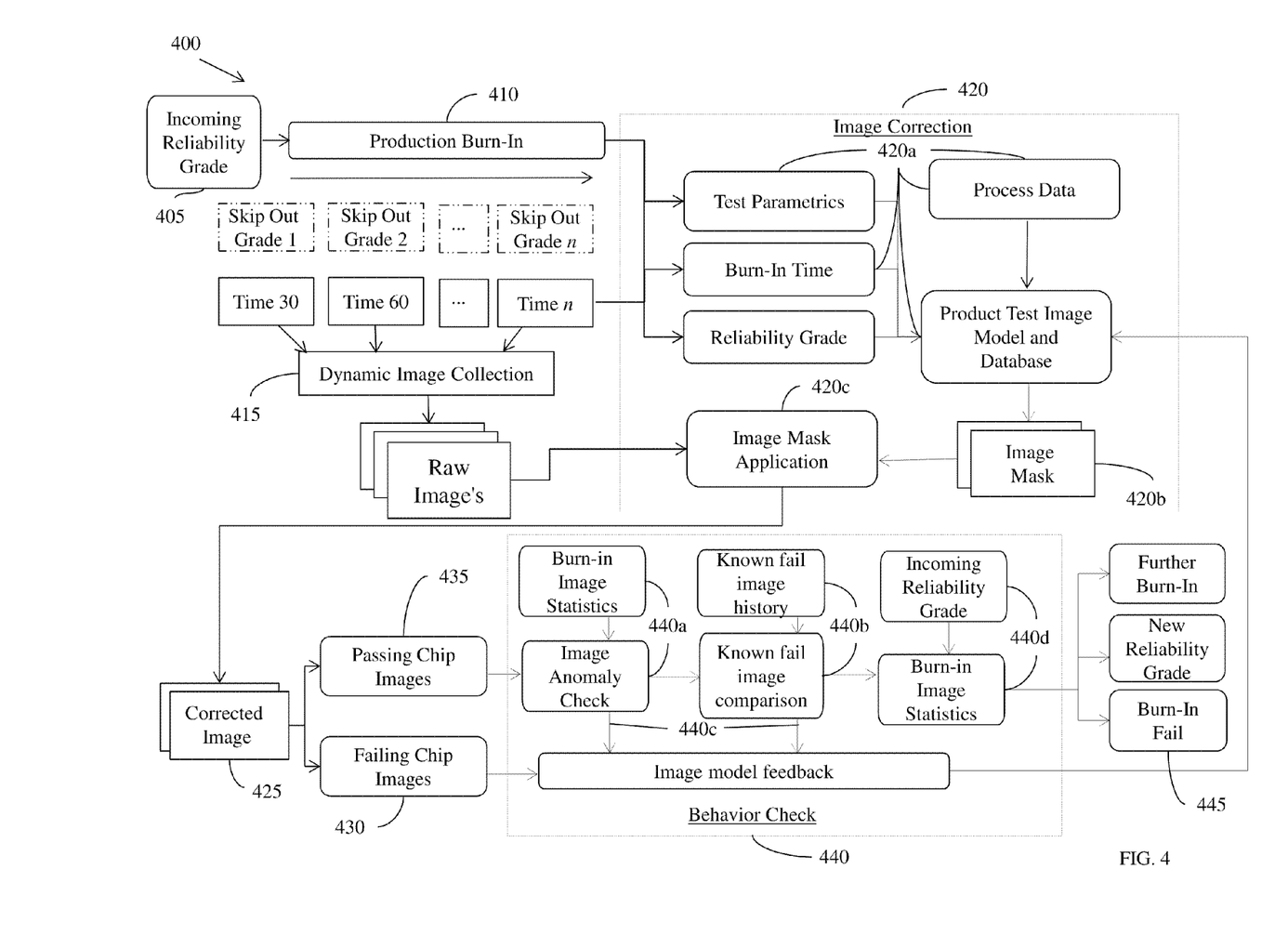

FIG. 4 shows a chip burn-in process 400 for at least one chip in accordance with aspect of the present invention. As shown in FIG. 4, the chip burn-in process 400 may comprise multiple stages that occur during the semiconductor fabrication process and prior to the semiconductor process being consummated. However, it should be noted that this burn-in process description is for illustration purposes only, and is not meant to limit the present invention. For example, an actual burn-in process may require a designer and/or manufacturer to perform the burn-in process in a different sequence than the sequence described herein.

Burn-in should be understood to comprise a process by which components of a chip or system are exercised prior to being placed in service (and often, prior to the chip or system being completely assembled from those components). The intention of burn-in is to detect those particular components that would fail as a result of the initial, high-failure rate portion of a bathtub curve of component reliability. If the burn-in period is made sufficiently long (and, perhaps, artificially stressful), the chip or system can then be trusted to be mostly free of further early failures once the burn-in process is complete. Thus, by applying a burn-in, early in-use chip or system failures can be avoided at the expense (tradeoff) of a reduced yield caused by the burn-in process.

At step 405, at least one incoming reliability grade may be received. The incoming reliability grade may be singular (e.g., the at least one chip has a reliability grade of 90%) or the incoming reliability grade may be tiered (e.g., the chips fall into one of multiple reliability grades such as 90%, 10%, and 3%). In embodiments, the reliability grade(s) may be imported or received from step 240 of the wafer testing process 200.

At step 410, a production chip burn-in process may be performed. In embodiments, the production chip burn-in process may be a step performed during semiconductor device fabrication. For example, during this step at least one chip is subjected to a burn-in process. The burn-in process may be performed by stressing equipment such as a burn-in oven. In embodiments, the chip burn-in process may comprise exposing the chip to a stress such as increased temperature in the burn-in oven for any length of time (e.g., Time 30-Time n). For example, the burn-in process may comprise exposing the at least one chip to a predetermined temperature range in the burn-in oven for a predetermined amount of time (e.g., Time 60).

In embodiments, the predetermined amount of time may be based on data collected during the previous design and/or fabrication stages of the at least one chip. For example, if a grade one reliability was assigned to the at least one chip at step 240 of the wafer testing process 200, then the at least one chip may be only exposed to the burn-in process for 30 minutes (e.g., Time 30). In other words, the designation of a reliability grade one from the previous processes allows for the manufacturer to assume that 30 minutes of burn-in is sufficient to detect those particular components that would fail as a result of the initial, high-failure rate portion of a bathtub curve of component reliability.

In embodiments, during the chip burn-in process, various data may be collected that is relevant to the performance and stability of integrated circuits on the chip. For example, any number of test parametrics may be collected during the chip burn-in process. In accordance with aspects of the invention, the test parametrics may be anything that is a continuous variable encountered during the chip burn-in process (e.g., voltage readings, current readings, timing readings, speed readings, performance readings, temperature readings, etc.). Additionally, during the performance of the chip burn-in process, the burn-in time data may be collected (e.g., Time 30-Time n).

At step 415, dynamic image collection of a portion or all individual integrated circuits that are present on the chip may be performed during the chip burn-in process. Typically various types of imaging techniques (e.g., thermal, magnetic, and photon) may be implemented in a manufacturing test program on a case by case basis to diagnosis and isolate a known electrical failure. However, in accordance with aspects of the present invention, the dynamic image collection using these various types of imaging techniques may be performed regardless of case or any known electrical failures. Instead, the dynamic image collection may be performed to provide a series of raw images (e.g., snap shots) representative of various stages or at various times through-out the burn-in process (e.g., Time 30, Time 60-Time n).

At step 420, the raw images (obtained in step 415) may then be corrected to account for variability within the images that is a result of normal and typically unavoidable fabrication variability and the burn-in processes. In embodiments, the image correction process may comprise: (step 420a) collecting the reliability grade data (received in step 405), the test parametric data (obtained in step 410), the burn-in time data (obtained in step 410), process data, product test image models, and fabrication database data; (step 420b) generating an image mask using the various collected data from step (420a); and (step 420c) applying the image mask to the raw images to generate the corrected images.

In embodiments, the generating the image mask may comprise: (i) comparing the test parametric data, the burn-in time data, and the process data for the chips passed through the burn-in process (chips of interest) to the test parametric data, the burn-in time data, and/or the process data for other wafers or chips previously manufactured and stored within the database; (ii) identifying the other wafers or chips that have similar test parametric data, burn-in time data, and/or process data to that of the chips of interest, and retrieving their associated test image data or models; (iii) using the retrieved test image data or models for the similar wafers or chips to determine similar types of variation and burn-in that the chips of interest could have been exposed to during the manufacturing process; and (iv) generating an image mask that is configured to separate the determined similar types of variation and burn-in from potential defects or anomalies on the chips of interest.

In embodiments, the applying the image mask may include applying the image mask generated in (iv) to the raw images of the chips of interest such that the raw images are corrected or normalized in a manner in which the determined similar types of variation and burn-in are stripped out of the raw images. For example, the corrected or normalized images consist essentially of the potential defects and not the variation caused by the test parametrics and the burn-in processes of the chips of interest. As should be understood by those of ordinary skill in the art, the generating and applying the image mask with respect to the burn-in process 400 is similar to that of the wafer testing process 200, as discussed with respect to FIGS. 2 and 3, such that further explanation is not included herewith.

At step 425, the corrected or normalized images are collected and analyzed to separate passing chip images from failing chip images. In embodiments, the failing chip images are identified as those chips that had an electrical failure that was detected during the burn-in processes. The failing chip images are the images of the chips that typically get thrown out or recycled during conventional burn-in processing. The passing chip images are identified as those chips that did not have an electrical failure detected during the burn-in processes. The passing chip images are the images of the chips that may potentially identify a defect or anomaly that could cause a chip failure at a later time.

At step 430, the failing chip images are fed back into the feedback loop for future use in generating image masks and determining the possibility of failure in chips. At step 435, the passing chip images are fed into a chip behavior check analysis to determine whether defects or anomalies that could potential cause a chip failure exist in the chip beyond the typical electrical failures determined by the burn-in process.

At step 440, the behavior check analysis is performed on the passing chip images identified in step 435. In embodiments, the behavior check analysis is configured to determine whether defects or anomalies that could potential cause a chip failure exist in the chip. The behavior check analysis may comprise: (step 440a) performing a defect or anomaly check on the passing chip images using historical burn-in image statistics; (step 440b) performing a known fail image comparison between the passing chip images and historical failure imaging; (step 440c) feeding all of the data created from the anomaly check and the image comparisons back into the feedback loop for future use in generating image masks and determining the possibility of failure in chips; and (step 440d) determining whether any defects or anomalies and/or known fails were identified subsequent to the burn-in process, and adjusting the incoming reliability grade according. As should be understood by those of ordinary skill in the art, the performance of the defect or anomaly check (step 440a), the known fail image comparison (step 440b), and feeding of the data back into the feedback loop (step 440c) with respect to the burn-in process 400 is similar to that of the wafer testing process 200, as discussed with respect to FIG. 2, such that further explanation is not included herewith.

At step 440d, all of the data created from the defect and anomaly check (e.g., the identification of any drastic differences between the passing burn-in chip images and the historical burn-in data that may include defects or anomalies that could cause a chip failure) and the image comparisons (e.g., images of the passing burn-in chips that have the identified or unidentified defect or anomaly that could cause a chip failure) are used to determine whether any defects or anomalies and/or known fail conditions were identified subsequent to the burn-in process. For example, new defects or anomalies and/or known fail conditions beyond those discovered in the wafer testing process 200. The newly identified defects or anomalies and/or known fail conditions may then be used to adjust the incoming reliability grade received in step 405. For example, if the chip had a previous reliability grade of 90%, but the defect or anomaly check identified a new defect or anomaly that is present subsequent to the burn-in process, then the incoming reliability grade for the chip may be adjusted to 10% based on this new data.

At step 445, the passing chips are sorted into different categories based on the defect and anomaly check, the known fail image comparison, and the adjusted incoming reliability grade performed and determined in the behavior analysis check. For example, passing chip images that have not been identified to have a defect or anomaly and do not have a match with the known fail image history may be placed into a first category, e.g., a further burn-in processing category. In embodiments, the further burn-in processing may include a burn-in process that has increased parameters (e.g., temperature) and/or length of time exposed to the stressing conditions. The passing chip images that are identified to have an adjusted incoming reliability grade may be placed into a second category, e.g., a new reliability grade category. The passing chip images that are identified to have a defect or anomaly and/or match with the known fail image history that results in a reliability that is unacceptable may be placed into a third category, e.g., a failed chip category. However, it should be understood that the above identified categories are provided for illustrative purposes only and are not presented to limit the invention.

Accordingly, embodiments of the present invention provide for a means to overcome the inherent variability of chip imaging subsequent to burn-in processing, and provide for an effective and efficient means for detecting defects or anomalies in chips that may cause a failure of the chip.

Performance Testing

Figure 5:
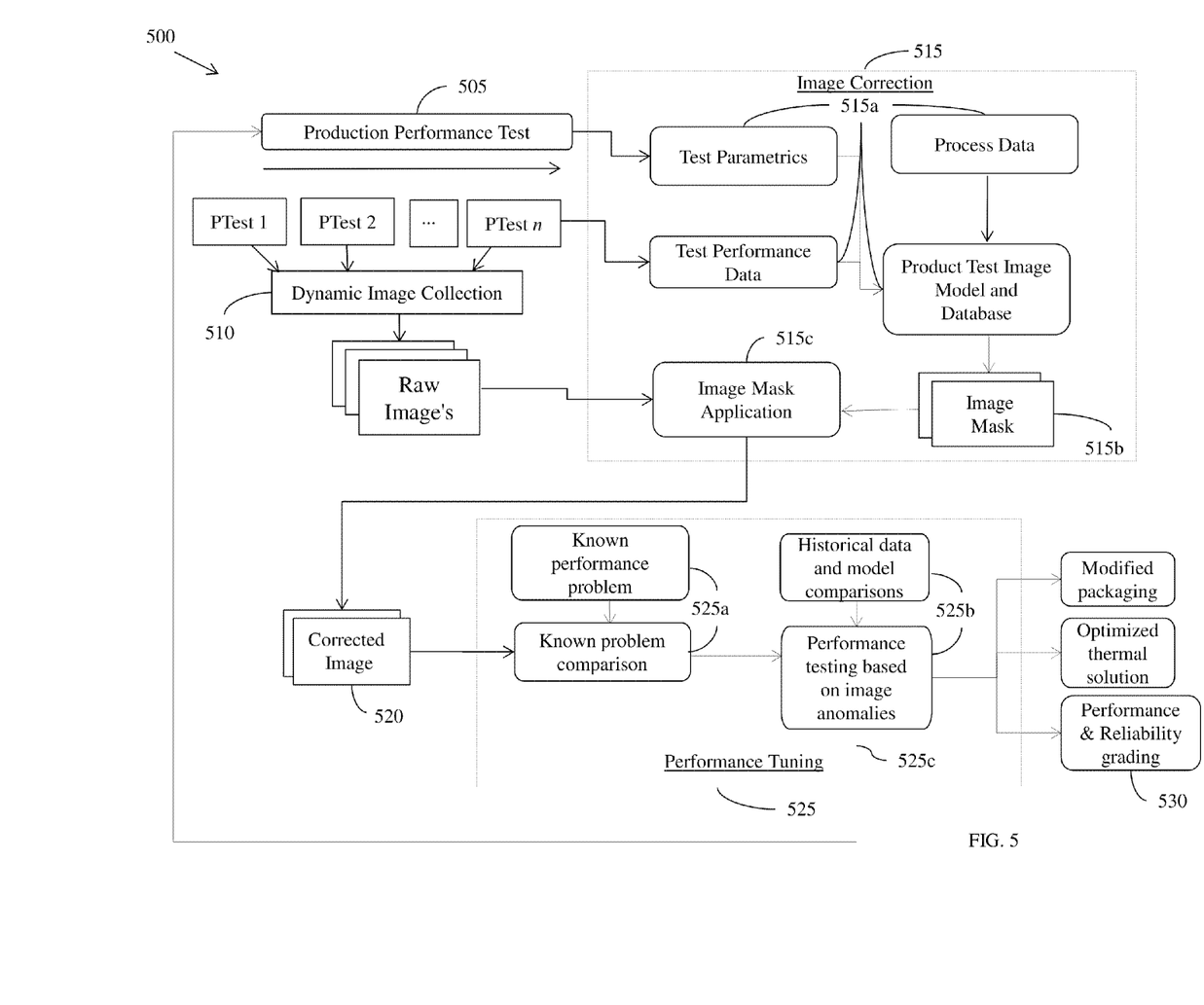

FIG. 5 shows a performance testing process 500 for at least one chip in accordance with aspects of the present invention. As shown in FIG. 5, the performance testing process 500 may comprise multiple stages that occur during the semiconductor fabrication process and prior to the semiconductor process being consummated. However, it should be noted that this performance testing process description is for illustration purposes only, and is not meant to limit the present invention. For example, an actual performance testing process may require a designer and/or manufacturer to perform the performance testing process in a different sequence than the sequence described herein.

At step 505, a production performance testing may be performed. In embodiments, the performance testing may be a step performed during semiconductor device fabrication. For example, during this step a portion or all individual integrated circuits that are present on the chip may be tested for performance by applying special test patterns to the integrated circuits. In embodiments, the production performance testing may comprise any number of steps or tests being performed (e.g., PTest 1-PTest n). For example, the production performance testing may comprise any number of performance tests performed using various testing patterns in a predetermined sequence. In embodiments, during the performance testing, various data may be collected that is relevant to the performance of the integrated circuits on the chip. For example, the speed at which the integrated circuits perform may be recorded (e.g., 3.5 gHz).

At step 510, dynamic image collection of a portion or all individual integrated circuits that are present on the wafer may be performed during the performance testing. Typically various types of imaging techniques (e.g., thermal, magnetic, and photon) may be implemented in a manufacturing test program on a case by case basis to diagnosis and isolate a known electrical failure. However, in accordance with aspects of the present invention, the dynamic image collection using these various types of imaging techniques may be performed regardless of case or any known electrical failures. Instead, the dynamic image collection may be performed to provide a series of raw images (e.g., snap shots) of each or a portion of the number of tests being performed (e.g., PTest 1-PTest n).

At step 515, the raw images (obtained in step 510) may then be corrected to account for variability within the images that is a result of normal and typically unavoidable fabrication variability. In embodiments, the image correction process may comprise: (step 515a) collecting the test performance data (obtained in step 505), the test parametric data (obtained from previous processes 200 and 400), process data, product test image models, and fabrication database data; (step 515b) generating an image mask using the various collected data from step (515a); and (step 515c) applying the image mask to the raw images to generate the corrected images.

In embodiments, the generating the image mask may comprise: (i) comparing the test parametric data, the test performance data, and the process data for the chips passed through the performance test (chips of interest) to the test parametric data, the test performance data, and/or the process data for other wafers or chips previously manufactured and stored within the database; (ii) identifying the other wafers or chips that have similar test parametric data, test performance data, and/or process data to that of the chips of interest, and retrieving their associated test image data or models; (iii) using the retrieved test image data or models for the similar wafers or chips to determine similar types of variation that the chips of interest could have been exposed to during the manufacturing process; and (iv) generating an image mask that is configured to separate the determined similar types of variation from potential defects or anomalies on the chips of interest.

In embodiments, the applying the image mask may include applying the image mask generated in (iv) to the raw images of the chips of interest such that the raw images are corrected or normalized in a manner in which the determined similar types of variation are stripped out of the raw images. For example, the corrected or normalized images consist essentially of the potential defects and not the variation caused by the test parametrics of the chips of interest. As should be understood by those of ordinary skill in the art, the generating and applying the image mask with respect to the performance testing process 500 is similar to that of the wafer testing process 200, as discussed with respect to FIGS. 2 and 3, such that further explanation is not included herewith.

At step 520, the corrected or normalized images are collected and input into a performance tuning analysis. At step 525, the performance tuning analysis is performed to determine whether the performance of the chips may be improved by tuning the chips. In embodiments, the performance tuning analysis may comprise: (step 525a) performing a known performance problem image comparison between the corrected chip images and historical performance problem imaging; (step 525b) performing tuning based on image defect or anomalies and/or the historical performance problem imaging and idealistic models; and (step 525c) feeding the newly tuned chip back into the performance test at step 505 for further performance testing.

At step 525a, the corrected images of the chips passed through the performance test (e.g., chips of interest) may be analyzed with respect to known performance problem history stored in the database. In embodiments, the known performance problem history may include images of chips that are known to have performance issues in the past (e.g., the images of chips with known customer performance problems). In other words, the corrected chip images may be compared to images of chips that are known to have performance issues to determine whether there are any similarities between the corrected chip images and the images of chips with known performance issues.

At step 525b, the corrected chip images are analyzed with respect to historical performance chip statistics that may comprise the images of chips stored in the database. In embodiments, the historical performance chip statistics may comprise any chip data stored in the database for previously fabricated wafers and chips without regard to test parametric or state data and process data. In other words, the performance chip images may be compared to any historical data (e.g., raw and/or corrected image data) of previously fabricated wafers or chips to determine whether there are any drastic differences between the corrected chip images and the historical data. The comparison may include setting a differentiation threshold as discussed previously with respect to process 200.

Once the corrected chip images are analyzed with respect to the known performance problems and the historical performance chip statistics, the performance of the chip may be compared to historical idealistic models. In embodiments, the idealistic models may include a simulation generated from the design data for the chip of interest in ideal conditions. For example, the idealist model may show that in idealistic conditions the chip of interest could perform at a speed of 5 gHz. Accordingly, in accordance with aspects of the invention, the test performance data for the chip of interest nay be compared to the idealistic model for the chip and the chip may be modified or tuned in order to compensate for any determined known performance problems and/or discovered defects or anomalies that could be compensated for the achieve a performance closer to the idealistic model. In embodiments, the modification or tuning of the chip may include adding delay to a circuit, changing the timing of a circuit, increasing the input voltage of a circuit, decreasing the temperature at which the circuit is running, etc.

At step 525c, the newly tuned chip is fed back into the performance test at step 505 for further performance testing (e.g., an optimization feedback loop). Once the chip of interest has been tuned to achieve a satisfactory performance based on either customer or manufacturer design targets, the chip of interest may passed out of the optimization feedback loop to a final modification step.

At step 530, the chips of interest are sorted into different categories based on the defect and anomaly check, the known performance problem comparison, and the adjusted tuning performance. For example, chip images that have been identified to have a defect or anomaly and/or a known performance problem may be placed into a first category, e.g., a modified package processing category. In embodiments, the modified package processing may include modifying the packaging process of the chip such that the defect or anomaly and/or the known performance problem is compensated for or tuned out. The chip images that have been identified with a defect or anomaly and/or a known performance problem may be placed into a second category, e.g., an optimized thermal solution processing category. In embodiments, the optimized thermal solution processing may include providing a thermal solution at specific locations of the chip such that the defect or anomaly and/or the known performance problem is compensated for or tuned out. The chip images that have been identified to have a defect or anomaly and/or a known performance problem may be placed into a third category, e.g., a performance and reliability grade processing category. In embodiments, the performance and reliability grade processing may include performing a performance binning process (e.g., speed binning) such that the chips of interests are sorted into respective bins based on performance. However, it should be understood that the above identified categories are provided for illustrative purposes only and are not presented to limit the invention.

Accordingly, embodiments of the present invention provide for a means to overcome the inherent variability of chip imaging to optimize performance of a chip, and provide for an effective and efficient means for detecting defects or anomalies in chips that may cause performance issues for the chip.

Three Dimensional (3D) Chip Stacks

Figure 6:
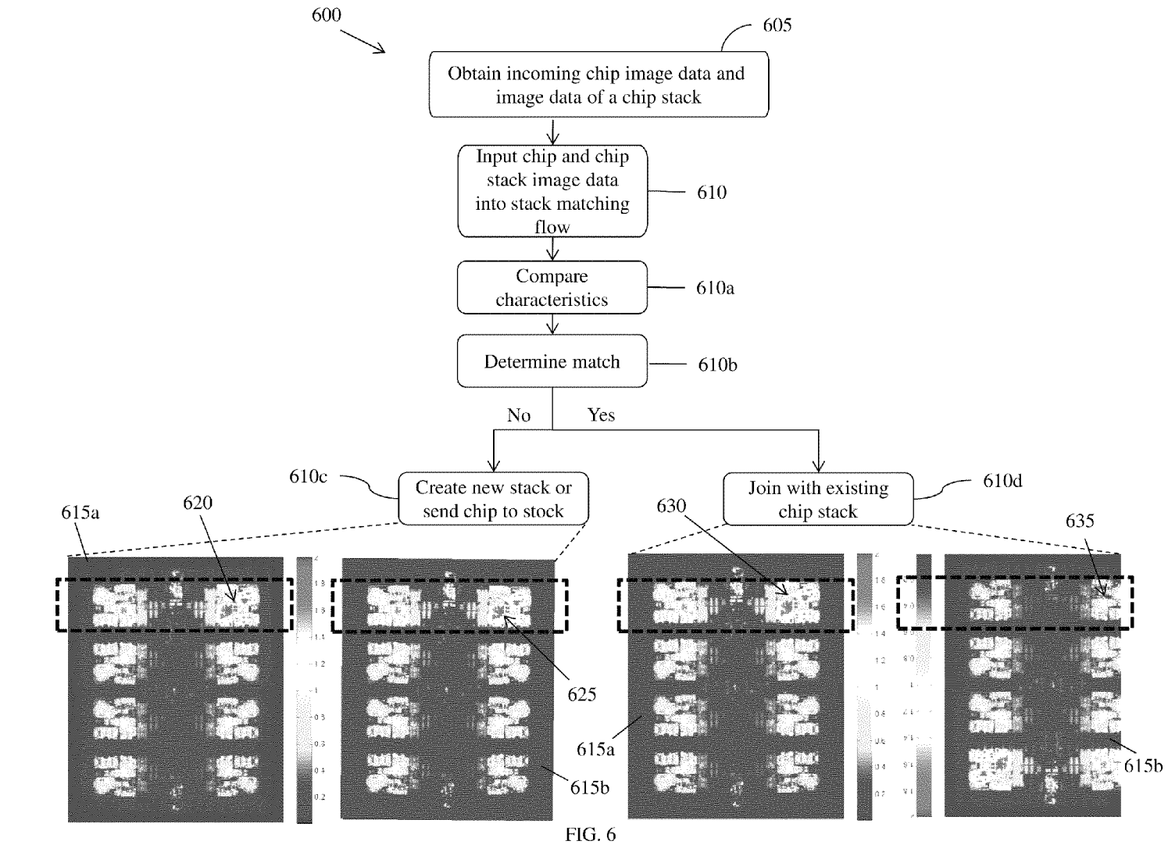

FIG. 6 shows a 3D chip stacking process 600 for at least one chip stack in accordance with aspects of the present invention. As shown in FIG. 6, the 3D chip stacking process 600 may comprise multiple stages that occur during the semiconductor fabrication process and prior to the semiconductor process being consummated. However, it should be noted that this 3D chip stacking process description is for illustration purposes only, and is not meant to limit the present invention. For example, an actual 3D chip stacking process may require a designer and/or manufacturer to perform the 3D chip stacking process in a different sequence than the sequence described herein.

A 3D chip stack should be understood to comprise a chip stack in which two or more layers of active electronic components are integrated both vertically and horizontally into a single circuit. At step 605, incoming chip image data may be obtained for at least one chip (e.g., an IC chip or circuit board potentially being joined to a chip stack). Additionally, image data for an existing chip stack may be obtained (e.g., the chip stack that may potentially be joined to the at least one chip). In accordance with aspects of the present invention, the image data may comprise thermal, magnetic, and/or photon images of characteristics for the at least one chip and chip stack. These characteristics may be, for example, electrical characteristics obtained during a wafer testing, burn-in characteristics obtained during a burn-in process, and/or performance characteristics obtained during a performance testing of an integrated circuit on the at least one chip or chip stack. In embodiments, the image data may be existing image data obtained during the fabrication processes of the at least one chip or chip stack. In additional or alternative embodiments, the image data may be obtained dynamically during the processes 200, 400, and 500 of the at least one chip or chip stack.

At step 610, the image data may be input into an optimization flow, as described herein. In embodiments, the optimization flow may include: (step 610*a*) comparing the characteristics of the incoming chip image data to respective characteristics of the laminate (e.g., a packaging device) or chips already assembled as a portion of the chip stack; (610*b*) determining whether the characteristics of the respective chips/laminate match up to avoid an unbalanced profile (e.g., uneven thermal profile); (610*c*) if the respective chips/laminate do not match up to avoid an unbalanced profile, then the at least one chip may be used to start a new chip stack or be placed back into the chip stock or pool to build another chip stack; and (610*d*) if the respective chips/laminate do match up to avoid an unbalanced profile, then using the at least one chip to build upon the chip stack.

For example, the optimization flow may include comparing the characteristics of respective chips, and making a determination as to whether there is a risk that the characteristics of the chips may potentially cause a failure of the chip stack. In embodiments, this determination may include comparing the images of the incoming chip (e.g., images 615*a* as shown in FIG. 6) to the images of the chips (e.g., images 615*b* as shown in FIG. 6) already part of the chip stack and determining whether the overall profile of the chip stack would be unbalanced if the incoming chip were joined to the chip stack. For example, a thermal threshold may be used, and if the image 615*a* of the chip stack shows a hot spot 620 in a certain location, and the image 615*b* of the incoming chip shows a hot spot 625 in a similar location, then the thermal threshold may be determined to be exceeded, and the incoming chip may not be added to the chip stack. Instead, the incoming chip may be added to another chip stack (e.g., based on a similar analysis with another chips stack), used to start a new chip stack, or placed back into the stock or pool of chips available to be added to a chip stack. On the other hand, if the image 615*a* of the chip stack shows a hot spot 630 in a certain location and the image 615*b* of the incoming chip shows a cool spot 635 in a similar location, then the thermal threshold may be determined not to be exceeded, and the incoming chip may be added to the chip stack.

Design Process

Figure 7:
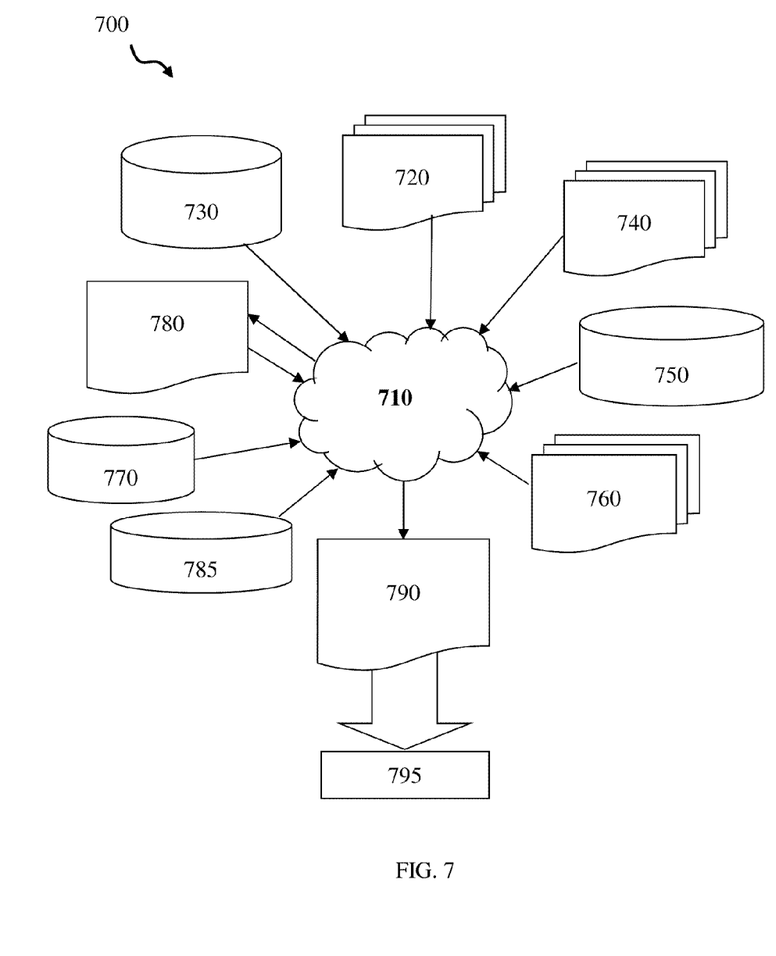
FIG. 7 is a flow diagram of a design process used in semiconductor design, manufacture, and/or test.

FIG. 7 is a flow diagram of a design process used in semiconductor design, manufacture, and/or test used with the system and method of the present invention. FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system, which can be implemented with the method and system of the present invention. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790.

Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more devices. In one embodiment, design structure 790 may comprise a compiled, executable HDL simulation model that functionally simulates the devices.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 790 may then proceed to a stage 795 where, for example, design structure 790: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing at least one wafer or chip, comprising:
    obtaining image data of the at least one wafer or chip dynamically during a production wafer test of the at least one wafer or chip;
    correcting the image data to remove normal variation within the image data wherein correcting the image data comprises:
        obtaining at least one of test parametric data, test state data, and process data for the at least one wafer or chip;
        comparing at least one of the test parametric data, the test state data, and the process data to historical data for other wafers or chips already fabricated to determine similar wafers or chips to that of the at least one wafer or chip;
        generating an image mask based on the historical data for the determined similar wafers or chips; and
        applying the image mask to the at least one wafer or chip thereby removing normal variation within the image data;
    comparing the corrected image data to image data for at least one other wafer or chip to determine whether the corrected image data for the at least one wafer or chip shows a defect or anomaly beyond that of the normal variation; and
    placing the at least one wafer or chip into a category of fabrication based on the comparison.

2. The method of claim 1, wherein the image data of the at least one wafer or chip comprises at least one of thermal, magnetic, and photon images.

3. The method of claim 1, wherein the generating the image mask comprises:
    retrieving image data associated with the determined similar wafers or chips;
    using the retrieved image data for the determined similar wafers or chips to determine similar types of variation that the at least one wafer or chip was exposed to during a fabrication process; and
    generating the image mask such that the image mask is configured to separate the determined similar types of variation from the defect or anomaly on the at least one wafer or chip.

4. The method of claim 2, further comprising separating the corrected image data into passing chip images and failing chip images based on whether the at least one wafer or chip had an electrical failure that was detected during steps or tests being performed for the production wafer test, wherein the comparing the corrected image data to the image data for the at least one other wafer or chip comprises comparing the passing chip images to the image data for the at least one other wafer or chip.

5. The method of claim 4, wherein the comparing the passing chip images to the image data for the at least one other wafer or chip comprises:
   comparing the passing chip images to historical chip statistics that comprise images of previously identified passing wafers or chips to determine whether there are differences between the passing chip images and the historical chip statistics; and
   comparing the passing chip images to a known fail image history that comprises images of wafers or chips that are known to have failed in the past to determine whether there are similarities between the passing chip images and the known fail image history.

6. The method of claim 5, wherein the placing the at least one wafer or chip into a category of fabrication comprises sorting the at least one wafer or chip into different reliability grades based on the determined differences and the determined similarities.

7. The method of claim 1, wherein the image data of the at least one wafer or chip is obtained dynamically during a burn-in process of the at least one wafer or chip, and the image data of the at least one wafer or chip comprises at least one of thermal, magnetic, and photon images.

8. The method of claim 7, further comprising:
   obtaining at least one of test parametric data, burn-in time data, and process data for the at least one wafer or chip;
   comparing at least one of the test parametric data, the burn-in time data, and the process data to historical data for other wafers or chips already subjected to the burn-in process to determine similar wafers or chips to that of the at least one wafer or chip;
   generating an image mask based on the historical data for the determined similar wafers or chips; and
   applying the image mask to the at least one wafer or chip to remove variation within the image data.

9. The method of claim 8, wherein the generating the image mask comprises:
   retrieving image data associated with the determined similar wafers or chips;
   using the retrieved image data for the determined similar wafers or chips to determine similar types of variation that the at least one wafer or chip was exposed to during the burn-in process; and generating the image mask such that the image mask is configured to separate the determined similar types of variation from the defect or anomaly on the at least one wafer or chip.

10. The method of claim 7, further comprising separating the corrected image data into passing chip images and failing chip images based on whether the at least one wafer or chip had an electrical failure that was detected during the burn-in process, wherein the comparing the corrected image data to the image data for the at least one other wafer or chip comprises comparing the passing chip images to the image data for the at least one other wafer or chip.

11. The method of claim 10, wherein the comparing the passing chip images to the image data for the at least one other wafer or chip comprises:
   comparing the passing chip images to historical burn-in statistics that comprise images of previously identified passing wafers or chips subjected to the burn-in process to determine whether there are differences between the passing chip images and the historical burn-in statistics;
   comparing the passing chip images to a known fail image history that comprises images of wafers or chips that are known to have failed in the past to determine whether there are similarities between the passing chip images and the known fail image history; and
   adjusting a reliability grade of the at least one other wafer or chip based on the determined differences and the determined similarities.

12. The method of claim 11, wherein the placing the at least one wafer or chip into a category of fabrication comprises sorting the at least one wafer or chip into a new reliability grade based on the adjusted reliability grade.

13. The method of claim 11, wherein the placing the at least one wafer or chip into a category of fabrication comprises sorting the at least one wafer or chip into different reliability grades based on the determined major differences and the determined similarities.

14. The method of claim 1, wherein the image data of the at least one wafer or chip is obtained dynamically during a production performance test of the at least one wafer or chip, and the image data of the at least one wafer or chip comprises at least one of thermal, magnetic, and photon images.

15. The method of claim 14, wherein the comparing the corrected image data to the image data for the at least one other wafer or chip comprises:
   comparing the corrected image data to historical performance statistics that comprise images of previously identified wafers or chips subjected to the production performance test to determine whether there are differences between the corrected image data and the historical performance statistics;
   comparing the corrected image data to a known fail image history that comprises images of wafers or chips that are known to have performance issues in the past to determine whether there are similarities between the corrected image data and the known fail image history; and
   adjusting performance of the at least one other wafer or chip based on the determined differences and the determined similarities.

16. A computer program product comprising a computer readable storage medium having non-transitory readable program code embodied in the storage medium, the computer program product includes including at least one component operable to that when executed directs a computer aided measuring and testing system to:
   obtain thermal, photon, or magnetic image data of at least one wafer or chip dynamically during a fabrication process production wafer test of the at least one wafer of chip;
   correct the image data to remove normal variation caused by the fabrication process within the image data, wherein correcting the image data comprises:
     obtaining at least one of test parametric data, test state data, and process data for the at least one wafer or chip;
     comparing at least one of the test parametric data, the test state data, and the process data to historical data for other wafers or chips already fabricated to determine similar wafers or chips to that of the at least one wafer or chip;
     generating an image mask based on the historical data for the determined similar wafers or chips; and
     applying the image mask to the at least one wafer or chip thereby removing normal variation within the image data;

compare the corrected image data to at least one standardized image to determine whether the corrected image data for the at least one wafer or chip shows a defect or anomaly beyond that of the normal variation; and place the at least one wafer or chip into a category of fabrication based on the comparison.

\* \* \* \* \*